United States Patent [19]
Kawaguchi et al.

[11] Patent Number: 5,489,859
[45] Date of Patent: Feb. 6, 1996

[54] CMOS OUTPUT CIRCUIT WITH HIGH SPEED HIGH IMPEDANCE MODE

[75] Inventors: Naoyuki Kawaguchi; Kazunori Shirakawa, both of Tokyo, Japan

[73] Assignee: Oki Electric Industry Co., Ltd., Tokyo, Japan

[21] Appl. No.: 278,067

[22] Filed: Jul. 20, 1994

[30] Foreign Application Priority Data

Jul. 21, 1993 [JP] Japan ................. 5-180364

[51] Int. Cl.$^6$ ................. H03K 19/00; H03K 19/094
[52] U.S. Cl. ................. 326/57; 326/17; 326/87; 326/88
[58] Field of Search ................. 326/57–58, 87–88, 326/83, 119, 121, 27, 17; 327/173, 263, 284–285

[56] References Cited

U.S. PATENT DOCUMENTS

| | | | |
|---|---|---|---|
| 4,757,214 | 7/1988 | Kobayashi | 327/263 |
| 4,772,812 | 9/1988 | Desmerais | 326/88 |
| 4,806,798 | 2/1989 | Kanauchi | 326/83 |
| 5,121,000 | 6/1992 | Naghsineh | 326/87 |
| 5,144,161 | 9/1992 | Inaba | 326/83 |
| 5,220,209 | 6/1993 | Seymour | 326/87 |

FOREIGN PATENT DOCUMENTS 58-196726A 11/1983 Japan.
3-24820A 2/1991 Japan.

*Primary Examiner*—Edward P. Westin
*Assistant Examiner*—Jon Santamauro
*Attorney, Agent, or Firm*—Spencer, Frank & Schneider

[57] ABSTRACT

In an output circuit for outputting an output signal having a given potential level in response to a potential level of an input signal wherein the output signal is permitted to be in high impedance state in response to a first potential level of a reset control signal having first and second potential levels, the output circuit comprises a second control circuit for outputting a second output control signal in response to the input signal at the time when the reset control signal has the second potential level and also for outputting a third output control signal at the time delayed by a first time counting from the outputting of the second output control signal, the second control circuit having a function to stop the outputting of the second output control signal in response to the change of the potential of the reset control signal from its second potential level to its first potential level and also a function to stop the outputting of the third output control signal substantially at the same time as the stoppage of the outputting of the second output control signal or at the time delayed by a second time which is shorter than the first time, thereby permitting the output terminal to be in high impedance at high speed.

17 Claims, 3 Drawing Sheets

5,489,859

CMOS OUTPUT CIRCUIT WITH HIGH SPEED HIGH IMPEDANCE MODE

BACKGROUND OF THE INVENTION

1. Field of the Invention

The present invention relates to an output circuit which is adapted for use in a semiconductor device, etc.

2. Description of the Related Art

There is a conventional output circuit as disclosed in Japanese Patent Laid-Open Publication No. 58-196726 (hereinafter referred to as a first reference) and Japanese Patent Laid-Open Publication No. 3-24820 (hereinafter referred to as a second reference). The first reference discloses two transistors connected in parallel with two output transistors which are serially connected between a power voltage and a ground voltage wherein operations of these two transistors are controlled by input and output signals of these two transistors when they are ANDed or ORed, thereby flowing a large load current so as to increase rise time of a power supply current. The second reference discloses a transistor connected in parallel with one of two output transistors which are serially connected between a power voltage and a ground voltage wherein an operation of the parallel connected transistor is controlled by an operation signals and its inverse operation signal of the output transistors when they are NORed, thereby suppressing ringing and speeding up access time.

There is also disclosed in the second reference that the outputs of the output transistors in the output circuit arc reset, namely, made in a high impedance state by a signal for deciding an output state of the output circuit.

The output signal of the output circuit has been recently required to be reset or be made in a high impedance state at high speed.

SUMMARY OF THE INVENTION

It is an object of the present invention to provide an output circuit capable of realizing to permit the output signal to be in a high impedance state at high speed.

DETAILED DESCRIPTION OF THE PREFERRED EMBODIMENTS

Figure 1:
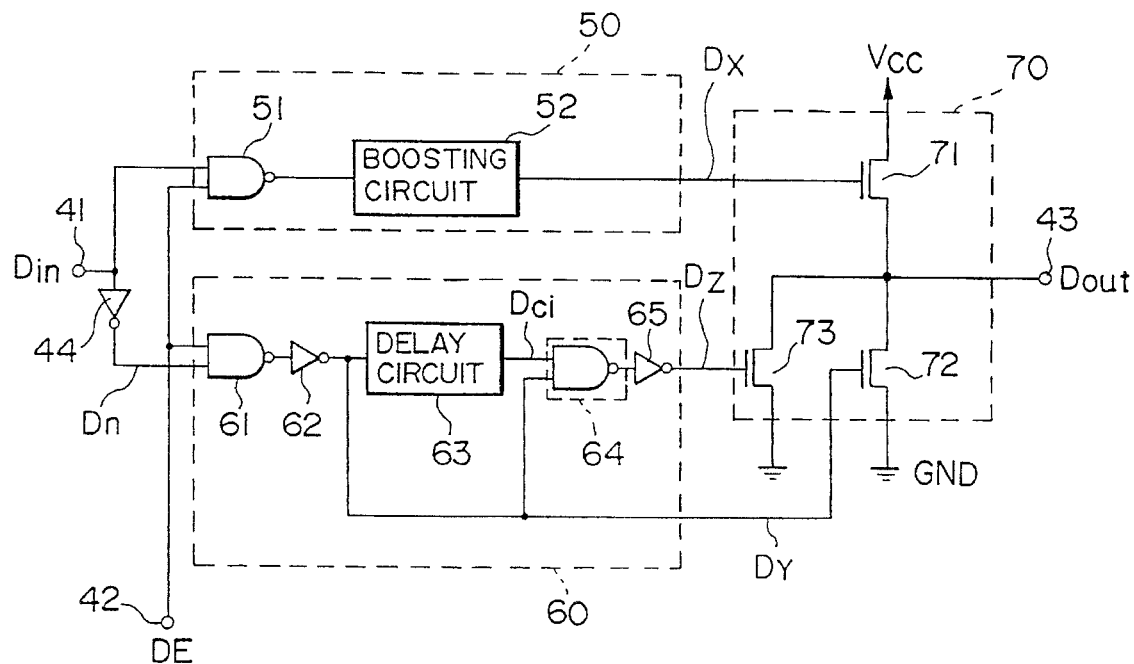
FIG. 1 is a circuit diagram of an output circuit according to a preferred embodiment of the invention.

An output circuit according to a preferred embodiment of the invention will be described with reference to FIGS. 1 to 5.

The output circuit in FIG. 1 comprises an input terminal 41 for receiving an input signal Din having a power supply potential level (hereinafter referred to as an "H" level) and a ground potential level (hereinafter referred to as an "L" level), a control input terminal 42 for receiving a reset control signal DE having an "H" level and an "L" level, an output terminal 43 for receiving an output signal Dout, an inverter 44 for receiving the input signal Din and outputting an inverse signal Dn having a potential level which is the inverse of the potential level of the input signal Din, a booster control circuit 50 for outputting a signal having a boosted potential level (hereinafter referred to as "VBOOT") which is boosted by a power potential Vcc in response to the potential level of the input signal Din, a delay control circuit 60 for outputting the inverse signal Dn at the time delayed by a given time, and an output buffer circuit 70 for outputting an output signal Dout having an "H" level and an "L" level in response to the boosted signal of the booster control circuit 50 and the signal from the delay control circuit 60. The reset control signal DE changes the potential level to "L" level when permitting the output terminal 43 to be in a reset state (permitted to be in a high impedance state) and also it changes the potential level to "H" level when permitting the output terminal 43 to be in a potential level in response to the input signal Din.

The booster control circuit 50 comprises a NAND gate 51 to which the input signal Din and the reset control signal DE are input and a boosting circuit 52 for outputting a first output control signal DX having the potential level which is "L" level or "VBOOT" level in response to the potential level of a signal representing the logical result of the NAND gate 51. That is, the NAND gate 51 outputs a signal having the potential level of "L" and the boosting circuit 52 outputs the first output control signal DX of the "VBOOT" level at the time only when the input signal Din and the control signal DE are respectively in "H" level. The boosting circuit 52 outputs the first output control signal DX of "L" level irrespective of the potential level of the input signal Din if the reset control signal DE is changed to "L" level so as to permit the output signal Dout to be in the reset state.

The delay circuit 60 comprises a NAND gate 61 to which the inverse signal Dn and the reset control signal DE are respectively input, an inverter 62 for outputting a second output control signal DY having a potential level which is the inverse of the potential level of a signal representing a logical result of the NAND gate 61, a delay circuit 63 for receiving the second output control signal DY when the input signal is in the first potential level and outputting a delay signal Dci at the time delayed by a given time counting from the reception of the second output control signal DY, a reset detecting circuit 64 composed of a NAND gate to which the second output control signal DY and the delay signal Dci are respectively input, and an inverter 65 for outputting a third output control signal Dz having a potential level which is the inverse of a potential level of a signal representing the logical result of the reset detecting circuit 64. That is, the delay control circuit 60 changes the potential level of the second output control signal DY to "H" level when the potential level of the inverse signal Dn of the inverter 44 is changed from "H" level to "L" level (the potential level of the input signal Din is changed from "L" level to "H" level) while the potential level of the reset control signal is in "H" level, and it changes the potential level of the third output control signal Dz to "H" level at the time delayed by a given time which is set by the delay circuit 63 after the potential level of the second output control signal DY is changed to "H" level. Further, the potential level of the second output control signal DY is changed to "L" level at the time when the inverse signal Dn of the inverter 44 is changed from the "L" level to "H" level (the potential level of the input signal Din is changed from "H" level to "L" level) while the potential level of the reset control signal DE is in "H" level, and at the same time when the potential level of the inverse signal Dn of the inverter 44 is in "H" level and the potential level of the reset control signal DE is changed from "H" level to "L" level, and the reset detecting circuit 64 changes the potential level of the third output control signal Dz to "L" level in response to the change of the potential level of the second output control signal DY after the change of the potential level of the second output control signal DY to "L" level. The time during which the potential level of the third output control signal Dz is changed from "H" level to "L" level after the change of the potential level of the second output control signal DY is faster than the time during which the potential level of the third output control signal Dz is changed from "L" level to "H" level. The reason is that the potential level of the third output control signal DZ is changed from "L" level to "H" level in response to the change of the potential level of the second output control signal DY before the potential level of the delay signal Dci as the output of the delay circuit 63 is changed so that the reset detecting circuit 64 detects the reset. When the potential level of the inverse signal Dn of the inverter 44 is in "L" level, the potential levels of the second and third output control signals DY and DZ are respectively in "L" levels irrespective of the potential level of the reset control signal DE.

An output buffer circuit 70 comprises three N-channel MOS transistors (hereinafter referred to simply as transistors) 71, 72 and 73. The power potential Vcc is always supplied to a source electrode of the transistor 71 and a drain electrode of the transistor 71 connected to the output terminal 43. The first output control signal DX as the output of the booster control circuit 50 is supplied to a gate electrode of the transistor 71. Accordingly, the transistor 71 is activated to thereby supply the power potential Vcc to the output terminal 43 when the potential level of the first output control signal DX is in "VBOOT" level while it is inactivated when the potential level of the first output control signal DX is in "L" level. A ground potential Vss is always supplied to a source electrode of the transistor 72 and a drain electrode thereof is connected to the output terminal 43. The potential level of the output control signal DY as the output of the inverter 62 of the delay control circuit 60 is supplied to a gate electrode of the transistor 72. Accordingly, the transistor 72 is activated when the potential level of the second output control signal DY is in "H" level so that the transistor 72 supplies the ground potential Vss to the output terminal 43 while it is inactivated when the second output control signal DY is in "L" level. The ground potential Vss is always supplied to a source electrode of the transistor 73 and a drain electrode of the transistor 73 is connected to the output terminal 43. The third output control signal DZ as the output of the delay control circuit 60 is supplied to a gate electrode of the transistor 73. Accordingly, the transistor 73 is activated when the potential level of the third output signal DZ is in "H" level so that the transistor 73 supplies the ground potential Vss to the output terminal 43 while it is inactivated when the third output signal DZ is in "L" level. As a result, the output buffer circuit 70 supplies the output signal $D_{out}$ having the potential level of "H" to the output terminal 43 when the potential level of the first output control signal DX is in the one which is boosted and greater than "H" level while the potential levels of the second and third output control signals DY and DZ are respectively in "L" level. The output buffer circuit 70 supplies the output signal $D_{out}$ having the potential level of "L" to the output terminal 43 when the potential levels of the second and third output control signals DY and DZ are respectively in "H" level while the potential level of the first output control signal DX is in "L" level.

Detailed arrangements of the boosting circuit 52 and the delay circuit 63 in FIG. 1 are described hereinafter with reference to FIGS. 2 and 3.

Figure 2:
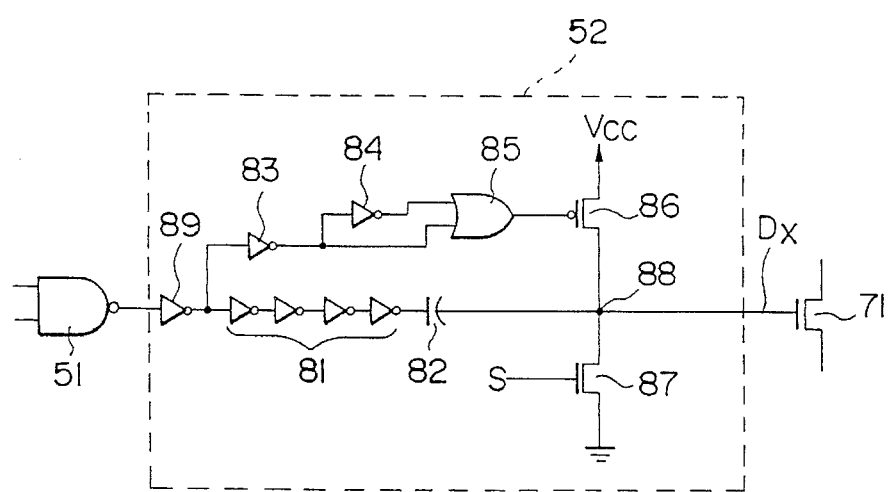
FIG. 2 is a circuit diagram of a boosting circuit in FIG. 1.

The boosting circuit 52 comprises, as shown in FIG. 2, a group of inverters (hereinafter referred to as inverter group) 81 composed of a plurality of inverters which are serially connected to one another, a capacitor 82, three inverters 83, 84 and 89, an OR gate 85, a P-channel MOS transistor 86 and an N-channel MOS transistor 87. The inverter 89 outputs a signal having a potential level which is the inverse of the potential level of the output signal of the NAND gate 51. The inverter group 81 outputs an output signal at the time delayed by the total times corresponding to the number of inverters counting from the outputting of the output signal of the inverter 89. The capacitor 82 receives an output signal of the inverter group 81 at its one end and it is connected to the gate electrode of the transistor 71 at its other end. The inverter 83 outputs an output signal having the potential level which is the inverse of the potential level of the output signal of the inverter 89. The inverter 84 outputs an output signal having the potential level which is the inverse of the potential level of the output signal of the inverter 83. The OR gate 85 outputs an output signal having the potential level representing the result of logical operation between the inverter 83 and the inverter 84. The power potential Vcc is always supplied to a source electrode of the transistor 86 and a drain electrode of the transistor 86 is connected to the gate electrode of the transistor 71. The transistor 86 receives the output signal of the OR gate 85 at its gate electrode. The ground potential Vss is always supplied to a source electrode of the transistor 87 and a drain electrode of the transistor 87 is connected to the gate electrode of the transistor 71. The transistor 87 receives a boosting control signal S at its gate electrode for controlling to fix the potential level of the output signal of the boosting circuit 52 to "L" level. The potential level of the boosting control signal S has the one which is the inverse of the potential level of the output signal of the OR gate 85 and it is changed in response to the change of the potential level of the output signal of the OR gate 85.

Figure 4:
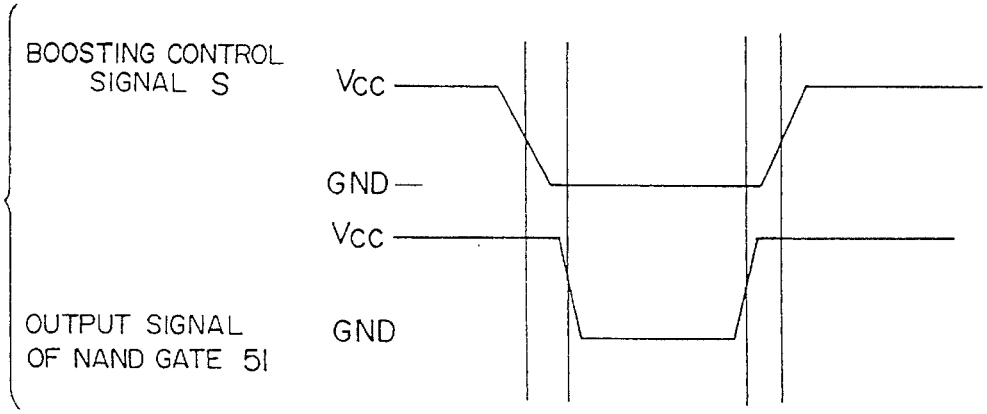
FIG. 4 is a timing chart showing an operation of the boosting circuit in FIG. 2.

An operation timing chart representing the changes of the potential levels of the output signals of the boosting control signal S and the NAND gate 51 is shown in FIG. 4. An operation of the boosting circuit 52 will be described with reference to FIG. 4.

In FIG. 4, supposing that the output signal of the NAND gate 51 is in "H" level, the output signal of the NAND gate 51 is changed to a first signal having the potential level of "H" by way of the inverter 89 and the inverter 83 and a second signal having the potential level of "L" which is the inverse of the aforementioned "H" level and these signals having "H" and "L" levels are respectively input to the OR gate 85. The potential level of the output signal of the OR gate 85 is changed to "H" level depending on the potential level of the input signal. The transistor 86 is inactivated by the output signal of the OR gate 85. At this time, the transistor 87 is activated since the potential level of the boosting control signal S is in "H" level. Accordingly, a signal having the potential level of "L" is supplied to the gate electrode of the transistor 71 and one end of the capacitor 82. The output signal of the NAND gate 51 is supplied to the other end of the capacitor 82 after it is delayed by the inverter group 81. As a result, the transistor 71 is inactivated.

Successively, when the output signal of the NAND gate 51 is changed from "H" level to "L" level, the potential level of the boosting control signal S is changed from "H" level to "L" level. Accordingly, the transistor 87 is inactivated so that the gate electrode of the transistor 71 and one end of the capacitor 82 become respectively in a high impedance state. In response to the change of the output signal of the NAND gate 51 from "H" level to "L" level, the potential level of this output signal is changed to "L" level by way of the inverter 89 and the inverter 83 and it is input to the OR gate 85. At this time, the output of the inverter 84 which is the other input of the OR gate 85 is in the potential level which is not the inverse of the potential level of the output signal of the inverter 83, namely, the signal having the potential level of "L" is input to the other input of the OR gate 85. Accordingly, the potential level of the output signal of the OR gate 85 is changed temporarily to "L" level. Accordingly, the transistor 86 is activated to thereby change the potential level of a node 88 to "H" level. As a result, the transistor 71 is activated upon reception of the potential level of the node 88 at its gate electrode. As mentioned previously, since the power potential Vcc is always supplied to the source electrode of the transistor 71, the potential level of the drain electrode of the transistor 71 is changed to the one expressed by Vcc–Vth (Vth represents a threshold potential of the transistor 71). Thereafter, the potential level of the output signal of the inverter 84 is changed to "H" level in response to the potential level of the output signal of the inverter 83, so that the potential level of the output signal of the OR gate 85 is changed to "H" level in accordance with the potential level of the input signal. The transistor 86 is inactivated in response to the output signal of the OR gate 85. Since the potential level of the boosting control signal S is held in "L" level at this time, the transistor 87 is inactivated. As a result, the current does not flow directly from the power potential Vcc to the ground potential Vss through the transistors 86 and 87 so that the potential level of the node 88 is held in "H" level. Thereafter, the output signal of the NAND gate 51 which is delayed by the inverter group 81 is supplied to the other end of the capacitor 82. Accordingly, the potential level of the signal which is supplied to the gate electrode of the transistor 71 is boosted from "H" level to "VBOOT" level when the capacitor 82 is discharged. As a result, since the potential level of the gate electrode of the transistor 71 is in "VBOOT" level, the potential level of the drain electrode of the transistor 71 is in the power potential Vcc ("H" level). Consequently, the current does not flow directly from the power potential Vcc to the ground potential Vss through the transistors 86 and 87.

Successively, when the output signal of the NAND gate 51 is changed from "L" level to "H" level, the potential level of the boosting control signal S is held in "L" level. In response to the change of the output signal of the NAND gate 51 from "L" level to "H" level, both the transistor 86 and the transistor 71 are respectively held in inactivated state. Thereafter, the potential level of the boosting control signal S is changed to "H" level, thereby permitting the transistor 87 to be activated while potential levels of the gate electrode of the transistor 71 and one end of the capacitor 82 are respectively changed to "L" level. As a result, the transistor 71 is inactivated, and hence the current does not flow directly from the power potential Vcc to the ground potential Vss through the transistors 86 and 87.

Figure 3:
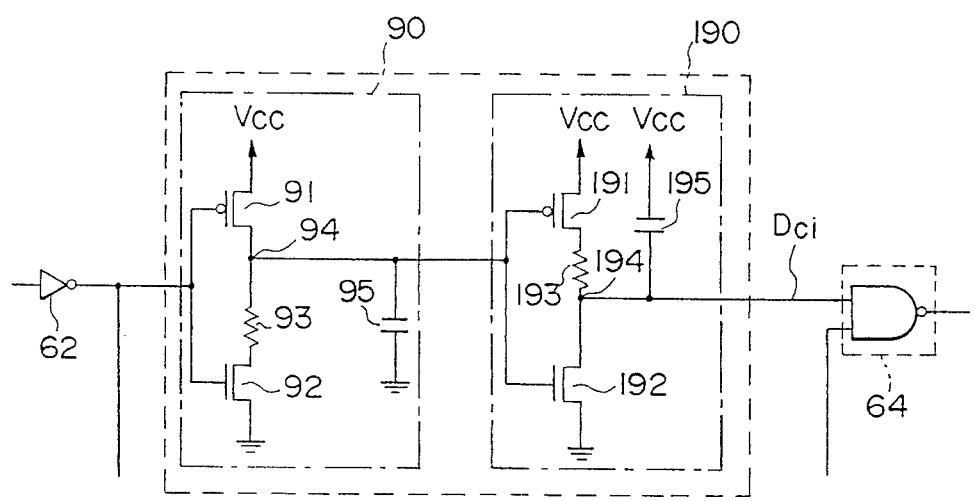
FIG. 3 is a circuit diagram of a delay circuit in FIG. 1.

The delay circuit 63 comprises a plurality of unit delay circuits which are serially connected to each other as shown in FIG. 3. The delay circuit 63 in FIG. 3 comprises first and second stages of unit delay circuits 90 and 190. The first stage of unit delay circuit 90 comprises a P-channel MOS transistor 91, an N-channel MOS transistor 92, a resistor 93 and a capacitor 95 while the second stage of unit delay circuit 190 comprises a P-channel MOS transistor 191, an N-channel MOS transistor 192, a resistor 193 and a capacitor 195. In the first stage of unit delay circuit 90, the power potential Vcc is always supplied to a source electrode of the transistor 91 and a drain electrode of the transistor 91 is connected to a node 94. The transistor 91 receives the output signal of the inverter 62 at its gate electrode. The ground potential Vss is always supplied to a source electrode of the transistor 92 and a drain electrode of the transistor 92 is connected to the node 94 by way of the resistor 93. The transistor 92 receives the output signal of the inverter 62 at its gate electrode. The capacitor 95 is connected to the node 94 at its one end and the ground potential Vss is always supplied to the other end of the capacitor 95. That is, in the unit delay circuit 90, two transistors 91 and 92 constitute an inverter which responds to the potential level of the output signal of the inverter 62 while the resistor 93 and the capacitor 95 constitute a time constant circuit for setting a delay time. In the second stage of unit delay circuit 190, the power potential Vcc is always supplied to a source electrode of the transistor 191 and a drain electrode of the transistor 191 is connected to a node 194 by way of the resistor 193. The transistor 191 receives the output signal of the unit delay circuit 90 at its gate electrode since it is connected to the node 94 by way of one end of the capacitor 95. The ground potential Vss is always supplied to a source electrode of the transistor 192 and a drain electrode of the transistor 192 is connected to the node 194. The transistor 192 receives the output signal of the unit delay circuit 90 at its gate electrode since it is connected to the node 94 by way of one end of the capacitor 95. The capacitor 195 is connected to the node 194 at its one end and the power potential Vcc is always supplied to the other end of the capacitor 195. That is, in the unit delay circuit 190, two transistors 191 and 192 constitute an inverter which responds to the potential level of the output signal of the first stage unit delay circuit 90 while the resistor 193 and the capacitor 195 constitute a time constant circuit for setting a delay time. The node 194 is connected to the reset detecting circuit 64 by way of one end of the capacitor 195 so as to permit the output signal of the unit delay circuit 190 to input to the reset detecting circuit 64 as one input signal thereof.

An operation of the delay circuit 63 will be described with reference to FIG. 3.

In FIG. 3, when the potential level of the output signal of the inverter 62 is in "L" level, the transistor 91 of the unit delay circuit 90 is activated while the transistor 92 is inactivated. Accordingly, the potential level of the node 94 is changed to "H" level. The potential level of the node 94 is supplied to the transistor 191 and the transistor 192 of the unit delay circuit 190 at the time delayed by the time corresponding to the time constant which is set by the resistor 93 and the capacitor 95. The unit delay circuit 190 changes the potential level of the node 194 to "L" level in response to the potential level of the node 94 ("H" level). The potential level of "L" of the node 194 is supplied to the detecting circuit 64 in response to the potential level of the output signal of the inverter 62 at the time delayed by the time corresponding the time constant which is set by the resistor 193 and the capacitor 195.

When the potential level of the output signal of the inverter 62 is in "H" level, the transistor 91 of the unit delay circuit 90 is inactivated while the transistor 92 is activated contrary to the case where the potential level of the output signal of the inverter 62 is in "L" level. Accordingly, the potential level of the node 94 is changed to "L" level. The potential level of the node 94 is supplied to the transistor 191 and the transistor 192 of the unit delay circuit 190 at the time delayed by the time corresponding to the time constant which is set by the resistor 93 and the capacitor 95. Thereafter, the delay circuit 63 operates contrary to the case where the potential level of the output signal of the inverter 62 is in "L" level. A signal having the potential level in response to the potential level of the output signal of the inverter 62 is supplied to the reset detecting circuit 64 at the time delayed at least by two time constants which are set by the time constant circuit of each unit delay circuit as the entire delay time of the delay circuit 63. In FIG. 3, two unit delay circuits are employed in the delay circuit 63, the number of unit delay circuits may be appropriately selected if they are even numbers corresponding to the time to be delayed. In case the odd numbers of unit delay circuits are employed, an inverter for inverting the potential level of the inverter 65 may be added in the manner that the output signal of the reset detecting circuit 64 is directly supplied to the gate electrode of the transistor 73 of the output buffer circuit 70 or the signal having the potential level which is the inverse of the potential level of the inverter 65 is supplied to the gate electrode of the transistor 73 without using the inverter 65 as shown in FIG. 1.

Figure 5:
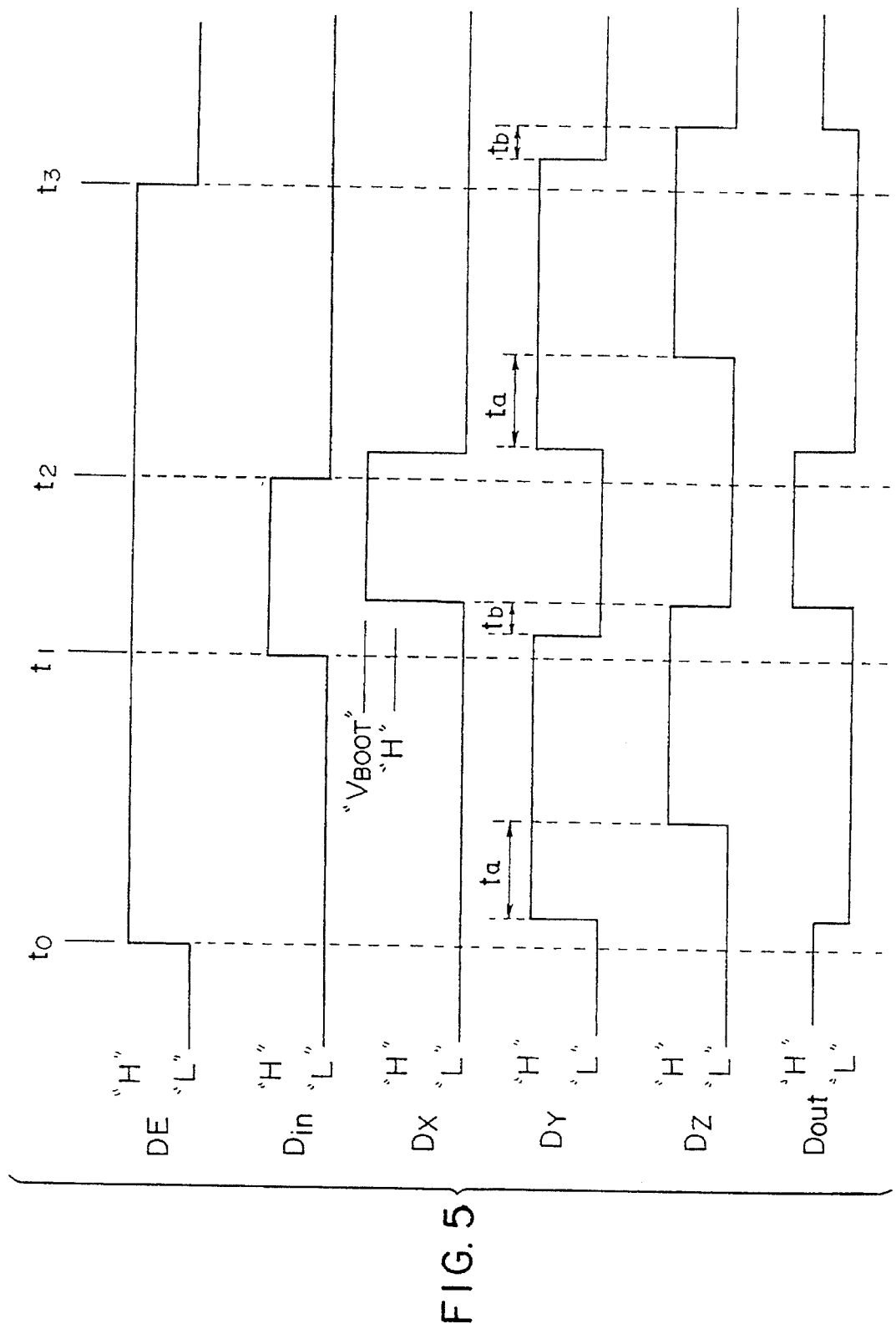
FIG. 5 is a timing chart showing an operation of the output circuit in FIG. 1.

An operation of the output circuit will be described with reference to FIG. 5 which is a timing chart showing the operation of the output circuit.

In an initial state (reset state), the reset control signal DE and the input signal Din are respectively in "L" level. Accordingly, the potential level of the first output control signal DX of the booster control circuit 50 and the potential level of the second and third output control signals DY and Dz of the delay control circuit 60 are all in "L" levels. At this time, the potential level of the boosting control signal S is in "L" level. As a result, since the transistors 71, 72 and 73 of the output buffer circuit 70 are all inactivated, the output signal $D_{out}$ of the output terminal 43 is permitted to be in high impedance state.

Thereafter, the potential level of the reset control signal DE is changed from "L" level to "H" level (time $t_0$) so as to release the reset state and output the output signal $D_{out}$ in response to the input signal Din. In response to this change of the potential level of the reset control signal DE, the output signal of the NAND gate 51 of the booster control circuit 50 is held in "H" level while the output signal of the NAND gate 61 of the delay control circuit 60 is changed from "H" level to "L" level. Accordingly, the potential level of the first output control signal DX is held in "L" level while the potential level of the second output control signal DY is changed from "L" level to "H" level. As a result, the transistor 72 of the output buffer circuit 70 is activated so that the potential level of the output signal $D_{out}$ of the output terminal 43 is changed to "L" level. Thereafter, the potential level of the third output control signal DZ is changed from "L" level to "H" level at the time delayed by the time ta by the delay circuit 63. As a result, the transistor 73 of the output buffer circuit 70 is also activated.

Successively, when the potential level of the input signal Din is changed from "L" level to "H" level (at time t1), the potential level of the output signal of the NAND gate 51 of the booster control circuit 50 is changed from "H" level to "L" level so that the potential level of the output signal of the NAND gate 61 of the delay control circuit 60 is changed from "L" level to "H" level. At this time, the potential level of the boosting control signal S is held in "L" level. As a result, the potential level of the first output control signal DX is held in "L" level while the potential level of the second output control signal DY is changed from "H" level to "L" level. Accordingly, the transistor 72 of the output buffer circuit 70 is inactivated. The reset detecting circuit 64 responds to the change of the potential level of the second output control signal DY before the potential level of the delay signal Dci of the delay circuit 63 is changed so that the potential level of the third output control signal DZ is changed from "H" level to "L" level at the time delayed by the time tb. The time tb may be shorter than the time ta during which the potential level of the third output control signal DZ is changed from "L" level to "H" level after the potential level of the second output control signal DY is changed from "L" level to "H" level. As a result, the transistor 73 of the output buffer circuit 70 is inactivated. At this time, the output terminal 43 is permitted temporarily to be in high impedance state. When the potential level of the boosting control signal S is changed from "H" level to "L" level, the boosting circuit 52 changes the potential level of the first output control signal DX from "L" level to "VBOOT" level. Accordingly, the transistor 71 is activated so that the potential level of the output signal $D_{out}$ of the output terminal 43 is changed to "H" level. As mentioned above, the current does not flow directly from the power potential Vcc to the ground potential Vss if the transistors 71, 72, 73 of the output buffer circuit 70 are controlled not to be activated at the same time.

Thereafter, when the potential level of the input signal Din is changed from "H" level to "L" level (time t2), the potential level of the output signal of the NAND gate 51 of the booster control circuit 50 is changed from "L" level to "H" level while the potential level of the NAND gate 61 of the delay control circuit 60 is changed from "H" level to "L" level. At the same time when these potential levels are changed, if the potential level of the boosting control signal S is changed from "L" level to "H" level, the boosting circuit 52 changes the potential level of the first output control signal DX of the boosting circuit 52 from "VBOOT" level to "L" level. Accordingly, the transistor 71 is inactivated while the potential level of the second output control signal DY is changed from "L" level to "H" level. As a result, the transistor 72 of the output buffer circuit 70 is activated so that the potential level of the output signal $D_{out}$ of the output terminal 43 is changed to "L" level. Thereafter, the potential level of the third output control signal DZ is changed from "L" level to "H" level at the time delayed by the time ta by the delay circuit 63. The time tb may be shorter than the time ta during which the potential level of the third output control signal DZ is changed from "L" level to "H" level after the potential level of the second output control signal DY is changed from "L" level to "H" level. As a result, the transistor 73 of the output buffer circuit 70 is also activated. As mentioned above, the through current does not flow if the transistors 71, 72 and 73 of the output buffer circuit 70 are controlled not to be activated at the same time.

Successively, the potential level of the reset control signal DE is changed from "H" level to "L" level so as to permit the output signal $D_{out}$ to be reset (time t3). In response to this change of the potential level of the reset control signal DE, the potential level of the NAND gate 51 of the booster control circuit 50 is held in "H" level while the potential level of the output signal of the NAND gate 61 of the delay control circuit 60 is changed from "L" level to "H" level. In response to this change of the potential level of the output signal of the NAND gate 61, the potential level of the output signal of the booster control circuit 50 is held in "L" level while the potential level of the output signal of the NAND gate 61 is changed from "H" level to "L" level. Accordingly, the potential level of the first output control signal DX is in "L" level while the potential level of the second output control signal DY is changed from "H" level to "L" level. As a result, the transistor 72 of the output buffer circuit 70 is inactivated. The reset detecting circuit 64 changes the potential level of the third output control signal DZ from "H" level to "L" level at the time delayed by the time tb in response to the change of the potential level of the second output control signal DY before the potential level of the delay signal Dci of the delay circuit 63 is changed. As a result, the transistor 73 of the output buffer circuit 70 is inactivated. Accordingly, the output signal $D_{out}$ is permitted to be in high impedance state. The transistor 73 is inactivated by the reset detecting circuit 64 before the potential level of the delay signal Dci of the delay circuit 64 is changed so that the output signal $D_{out}$ is permitted to be in high impedance state at high speed.

As mentioned above in detail, the output circuit of the present invention is not limited to the aforementioned embodiment. For example, although the reset detecting circuit 64 of the delay control circuit 60 comprises the NAND circuit, it may comprise a NOR circuit or any other circuits if they have the same function as the NAND circuit. Furthermore, the boosting circuit 52, the delay circuit 63 and the output buffer circuit 70 may comprise other circuits if the latter has the same function as the former.

What is claimed is:

1. An output circuit for outputting an output signal having a given potential level in response to a potential level of an input signal, said output signal being in a high impedance state in response to a first potential level of a reset control signal having first and second potential levels, said output circuit comprising:

a first control circuit for outputting a first output control signal in response to said input signal when said reset control signal has the second potential level;

a second control circuit for outputting a second output control signal in response to said input signal when said reset control signal has the second potential level, and for outputting a third output control signal at a time delayed by a first time interval from the outputting of the second output control signal, said second control circuit stopping the outputting of said second output control signal in response to a change of potential level of said reset control signal from the second potential level to the first potential level, and stopping the outputting of said third output control signal substantially at the same time as the stopping of the outputting of the second output control signal or at a time delayed by a second time interval which is shorter than the first time interval; and an output buffer circuit operative in response to said first output control signal, said second output control signal, and said third output control signal, wherein said output buffer circuit outputs said output signal at a third potential level when receiving said first output control signal, wherein said output buffer circuit outputs said output signal at a fourth potential level when receiving said second output control signal and third output control signal, and wherein said output buffer circuit puts the output signal in a high impedance state when the outputting of said first output control signal, said second output control signal, and said third output control signal is stopped.

2. An output circuit according to claim 1, wherein said output buffer circuit comprises first, second and third transistors, said first transistor being connected between a third potential supply source and an output terminal and activated by said first output control signal, said second transistor being connected between a fourth potential supply source and said output terminal and activated by said second output control signal, and said third transistor being connected between said fourth potential supply source and said output terminal and activated by said third output control signal.

3. An output circuit according to claim 2, wherein said input signal has first and second potential levels, said first control circuit has a boosting circuit which is operative when said reset control signal has the second potential level, said boosting circuit outputting said first output control signal having a potential level which is higher than a power potential at the time when said input signal is in the second potential level.

4. An output circuit according to claim 2, wherein said input signal has first and second potential levels, said second control circuit further comprising a delay circuit which is operative when said reset control signal has the second potential level, said delay circuit receiving said second output control signal when said input signal is in the first potential level and outputting a delay signal at the time delayed by a given time counting from the reception of said second output control signal; and a third output control circuit for outputting said third output control signal in response to said second output control signal and said delay signal, said third output control circuit stopping the outputting of said third output control signal from said third output control circuit in response to only the change of the potential level of said second output control signal when said reset control signal is changed from the second potential level to the first potential level.

5. An output circuit according to claim 3, wherein said boosting circuit receives a boosting control signal for controlling to permit said first output control signal to be in a ground potential level at the time when said input signal is in the first potential level.

6. An output circuit according to claim 4, wherein said third output control circuit comprises a NAND circuit.

7. An output circuit according to claim 4, wherein said delay circuit comprises even numbers of unit delay circuits, said unit delay circuit comprising a time constant circuit for setting a delay time and a time constant.

8. In an output circuit for outputting an output signal having a given potential level in response to a potential level of an input signal having first and second potential levels, said output signal being permitted to be in high impedance state in response to a first potential level of a reset control signal having first and second potential levels, said output circuit comprising:

a first control circuit outputting a first output control signal in response to said input signal at the time when said reset control signal has the second potential level;

a second control circuit outputting a second output control signal in response to said input signal at the time when said reset control signal has the second potential level and also outputting a third output control signal at the time delayed by a first time counting from the outputting of the second output control signal, said second control circuit having a function to stop the outputting of said second output control signal in response to the change of potential level of said reset control signal from its second potential level to its first potential level and also a function to stop the outputting of said third output control signal substantially at the same time as the stoppage of the outputting of the second output control signal or at the time delayed by a second time which is shorter than the first time; and first, second and third switching circuits, said first switching circuit being connected between a third potential supply source and an output terminal and operative in response to said first output control signal, said second switching circuit being connected between a fourth potential supply source and said output terminal and operative in response to said second output control signal, and said third switching circuit being connected between a fourth potential supply source and said output terminal and operative in response to said third output control signal.

9. An output circuit according to claim 8, wherein said first control circuit has a boosting circuit which is operative when said reset control signal has the second potential level wherein said boosting circuit outputs said first control signal having a potential level which is higher than a power potential at the time when said input signal is in the second potential level.

10. An output circuit according to claim 8, said output circuit further comprising a delay circuit which is operative when said reset control signal has the second potential level, said delay circuit receiving said second output control signal when said input signal is in the first potential level and outputting a delay signal at the time delayed by a given time counting from the reception of said second output control signal; and a third output control circuit for outputting said third output control signal in response to said second output control signal and said delay signal, said third output control circuit stopping the outputting of said third output control signal from said third output control circuit in response to only the change of the potential level of said second output control signal when said reset control signal is changed from the second potential level to the first potential level.

11. An output circuit according to claim 9, wherein said boosting circuit receives a boosting control signal for controlling to permit said first output control signal to be in a ground potential level at the time when said input signal is in the first potential level.

12. An output circuit according to claim 10, wherein said third output control circuit comprises a NAND circuit.

13. An output circuit according to claim 10, wherein said delay circuit comprises even numbers of unit delay circuits, said unit delay circuit comprising a time constant circuit for setting a delay time and an inverter.

14. An output circuit for outputting an output signal having a given potential level in response to a potential level of an input signal having first and second potential levels, said output signal being in a high impedance state in response to a first potential level of a reset control signal having first and second potential levels, said output circuit comprising:

a first control circuit for outputting a first output control signal in response to said input signal when said reset control signal has the second potential level, said first control circuit having a boosting circuit which is operative when said reset control signal has the second potential level, said boosting circuit outputting said first output control signal having a potential level which is higher than a power potential at the time when said input signal is in the second potential level;

a second control circuit outputting a second output control signal in response to said input signal when said reset control signal has the second potential level, and for outputting a third output control signal at a time delayed by a first term counting from the outputting of the second output control signal, said second control circuit stopping said second output control signal when said reset control signal is changed from the second potential level to the first potential level, said second control circuit including a delay circuit which is operative when said reset control signal has the second potential level, said delay circuit receiving said second output control signal when said input signal is in the first potential level and outputting a delay signal at a time delayed by a given time interval from the reception of said second output control signal, and a third output control circuit for outputting said third output control signal at the time delayed by said given time interval in response to said second output control signal and said delay signal, said third output control circuit stopping the outputting of said third output control signal from said third output control circuit substantially at the same time as the stoppage of the outputting of the second output control signal or at a time delayed by a time interval which is shorter than the given time interval in response to only the change of the potential level of said second output control signal when said reset control signal is changed from the second potential level to the first potential level;

first, second and third switching circuits, said first switching circuit being connected between a third potential supply source and an output terminal and operative in response to said first output control signal, said second switching circuit being connected between a fourth potential supply source and said output terminal and operative in response to said second output control signal, and said third switching circuit being connected between a fourth potential supply source and said output terminal and operative in response to said third output control signal.

15. An output circuit according to claim 14, wherein said boosting circuit receives a boosting control signal for controlling to permit said first output control signal to be in a ground potential level at the time when said input signal is in the first potential level.

16. An output circuit according to claim 14, wherein said third output control circuit comprises a NAND circuit.

17. An output circuit according to claim 14, wherein said delay circuit comprises even numbers of unit delay circuits, said unit delay circuit comprising a time constant circuit for setting a delay time and an inverter.

* * * * *